United States Patent [19]

Mathias

[11] Patent Number: 5,346,558
[45] Date of Patent: Sep. 13, 1994

[54] SOLDERABLE ANISOTROPICALLY CONDUCTIVE COMPOSITION AND METHOD OF USING SAME

[75] Inventor: Eckart Mathias, Catonsville, Md.

[73] Assignee: W. R. Grace & Co.-Conn., New York, N.Y.

[21] Appl. No.: 82,653

[22] Filed: Jun. 28, 1993

[51] Int. Cl.$^5$ .............................. B23K 35/34
[52] U.S. Cl. ........................ 148/23; 148/26
[58] Field of Search ............................ 148/23–26

[56] References Cited

U.S. PATENT DOCUMENTS

| | | | |
|---|---|---|---|
| 4,342,606 | 8/1982 | Notton | 148/23 |
| 4,419,279 | 12/1983 | Abrams | 252/514 |
| 4,496,475 | 1/1985 | Abrams | 252/514 |
| 4,509,994 | 4/1985 | Barajas | 148/24 |
| 4,531,986 | 7/1985 | Barajas | 148/24 |
| 4,960,236 | 10/1990 | Hedges et al. | 228/180.1 |
| 5,001,542 | 3/1991 | Tsukagoshi et al. | 357/67 |
| 5,043,102 | 8/1991 | Chen et al. | 252/514 |
| 5,059,272 | 10/1991 | Kono et al. | 156/306 |
| 5,062,896 | 11/1991 | Huang et al. | 148/24 |
| 5,088,189 | 2/1992 | Brown | 29/840 |
| 5,136,365 | 8/1992 | Pennisi et al. | 148/24 |

*Primary Examiner*—Peter D. Rosenberg
*Attorney, Agent, or Firm*—Mary Ann Capria

[57] ABSTRACT

A novel anisotropically conductive solder paste and a method of use thereof to join metallic parts in electronic manufacturing processes, in particular surface-mount electronic manufacturing processes. The solder paste is fluxless and reflowable for purposes of repair and achieves electrical anisotropy by soldering component leads to circuit board pads, while maintaining electrical insulation properties between adjacent joints.

15 Claims, No Drawings

SOLDERABLE ANISOTROPICALLY CONDUCTIVE COMPOSITION AND METHOD OF USING SAME

FIELD OF THE INVENTION

This invention relates to a novel anisotropically-conductive solder paste and the method of use thereof in electronic manufacturing processes, in particular surface mount electronic manufacturing processes.

BACKGROUND OF THE INVENTION

A solder paste is a material that is capable of being applied to a substrate or surface in a specific pattern using screening or analogous methods which can subsequently undergo fusing to provide an electrical connection commonly referred to as a solder joint. Solder pastes generally comprise powdered metallic solders of various alloys such as tin-lead, tin-lead-silver, tin-lead-bismuth, tin-lead-antimony, tin-silver etc., contained in a vehicle including a flux. In addition a suspension medium, such as hydrogenated castor oil, may be present in the vehicle and combined with the flux to provide a solder paste of uniform texture.

In electronic circuitry, solder pastes are employed to secure electronic components to a circuit on a substrate such as plastic, ceramic, glass or the like. Circuits, similar to those used on printed circuit boards (PCBs) are produced on the substrates. The areas of the circuit to which electronic components are to be added are commonly referred to as pads. Generally in a typical surface mount electronics manufacturing process, a solder paste is screen or template printed onto the pads of the printed circuit board. Next, the electronic components are carefully positioned with their peripheral leads in contact with the solder paste-coated pads. The populated board is then passed through an oven to melt the solder in the paste and wet the pad and lead surfaces, thus achieving the solder joint.

Flux residues are generated by the reflowing of the solder paste. The flux residues are often corrosive and therefore must be removed from the circuit board. Typically, the removal of the flux residues is accomplished by washing the printed circuit board in a chlorinated-fluorocarbon (CFC) based solvent. Since CFC solvents present environmental hazards in their use and disposal, the removal of flux residues in addition to creating an extra step, may cause hazardous conditions in the workplace.

A further problem in generally performed surface mount electronic assembly in particular, fine-pitch electronic components, is that conventional solder paste often leads to electrical shorts between adjacent lead/pad connections. Traditionally, "anisotropic" or "Z-Axis" materials have been used to address this problem. Anisotropic materials interconnect electrically to metal surfaces by virtue of physical contacts created between said metal surfaces and conductive particle-to-particle contacts contained within the Z-Axis material to create an electrical continuity. These electrical contacts are maintained by fixing in place leads and pads and the particles in between them with a hardened resin and, optionally, holding the joints together with a dedicated, often permanent, fixture or clamp.

It would be advantageous in a surface mount electronic manufacturing process to have an anisotropic solder paste which does not produce corrosive flux residues when reflowed, and which minimizes the formation of electrical shorts between fine-pitch lead/pad joints during reflow soldering.

SUMMARY OF THE INVENTION

It is the object of the present invention to provide a fluxless, solderable, anisotropically-conductive, adhesive composition comprising a meltable alloy solder-particle/polymer composite paste. For purposes of this invention, the term "fluxless" is used to indicate a solderable, anisotropically-conductive adhesive composition to which no fluxing agent has been added, thereby creating a composition free of a fluxing agent. The composite paste is based upon a synthetic organic polymer or polymers which are soluble in one or more organic solvents having a boiling point less than or equal to the melting temperature of the metal alloy particles, the polymer being heat-softenable at or below the maximum reflow temperature of the metal alloy particles to permit molten solder to flow within the paste. The organic solvent is further characterized in that it has a boiling point above the softening temperature of the polymer. The above described composite paste is hereafter referred to as solderable, anisotropically-conductive adhesive ("SACA").

It is another object of this invention to provide a soldering composition which does not require the use of a flux composition, thereby eliminating the need for after-cleaning with environmentally hazardous solvents to remove the flux residues from soldered electrical joints.

It is also an object of this invention to provide a solder paste which overcomes or minimizes undesirable shorts between adjacent lead/pad connections, in particular, when fine-pitch electronic components are used. The SACA paste of the invention prevents or minimizes these shorts since it does not produce a continuous solder interconnection between adjacent lead/pad joints when applied onto pads and spaces using conventional techniques. Further, SACA is advantageously suitable for liberal, "blanket" application onto PCB pads to provide, after appropriate placement of the leaded components, a solder which is reflowable so that the soldered connection made between leads and pads retain electrical insulation properties between adjacent lead/pad joints or interconnections.

DETAILED DESCRIPTION

The novel solder paste composition of the present invention comprises meltable metal alloy powder or particles dispersed in a solution of an organic polymer dissolved in an organic solvent. The SACA paste composition generally contains an amount by weight of metal alloy powder filler of between about 50 to 90, preferably 65 to 80, weight percent based upon the total weight of the "solids" in the paste.

Suitable alloys include all of those used in conventional solder powder compositions, including expensive noble metals. Soldering alloys are commonly based on tin and/or lead with additions of one or more metals selected from the group Sb, In, Bi, Ag, Au, Cu, Fe, Zn, Al, Cd, Al and As. A list of typical soldering alloys may be found in Kirk-Othmer's Encyclopedia of Chemical Technology, 2nd Ed., Vol. 18, p. 544. As a generalization however, alloys of tin and lead are good general purpose solder alloys. Antimony is often used in place of lead for soldering food containers. Alloys of tin and silver are exceptionally free flowing, have enhanced strength compared with tin/lead, and have good electrical conductivity, and tin/lead/silver alloys are frequently used in the electronics industry for soldering silver-plated surfaces. It is also within the scope of this invention to use low-melting solder alloys, such as bismuth-, indium-, and the like, based solders. The particular metal alloy powder selected is dependent upon the environment in which the solder is used.

The term "powder" is used herein to describe substantially spherical, finely-divided metallic particles of solder alloys. The particle size of solder alloys may vary depending on the intended use. For example, conventional solder usage generally employs a particle size of from about 44 to about 74 microns. For use in the interconnection of fine-pitch components, the particle size may range from about 24 to about 44 microns. In the SACA paste of the present invention, the particle size of the solder alloy is preferably less than 37 microns. Most preferably, the particle size is less than 15 microns.

The organic polymers used in the present invention may be thermoset, elastomeric or thermoplastic polymers. Preferably, the organic polymer is a thermoplastic polymer. A variety of thermoplastic polymers are suitable provided that the polymer is thermally stable and sufficiently heat-softenable at or below the melting point of the metal alloy particles in the SACA paste to permit molten solder to flow within the polymer resin. Suitable thermoplastic polymers include polyesters, polyethylenes, polystyrenes, polyurethanes, polyvinyl chlorides or fluorides, polyamides, and polymers which will be apparent to those skilled in the arts in light of the present disclosure. Preferred thermoplastic polymers for use in the present invention are polyamide hot melt adhesive polymers, Uni-Rez® 2642 and Uni-Rez® 2665, which are commercially available from Union Camp Corporation in Savannah, Ga., and polyester polymers, Vitel® 1870 and Vitel® 3300, which are commercially available from Shell Chemical Company in Akron, Ohio.

Thermoset or elastomeric polymers useful in the SACA paste of the invention include polymers which remain liquid during the solder-wetting stage and does not produce gaseous by-products during the curing and soldering stage at a rate which produces bubbles in the polymer resin.

The SACA paste composition of the present invention contains between about 10% and 50% by weight of a solution of the organic polymer in an organic solvent which dissolves the organic polymer and which has a boiling point above the softening temperature of the polymer and below the melting temperature of the solder alloy. The polymer solution generally contains about 45% to 55% by weight of one or more organic solvents. Suitable organic solvents include, but are not limited to, aliphatic and aromatic alcohols and esters, aromatic and aliphatic hydrocarbons, aromatic-aliphatic hydrocarbons, and mixtures thereof. Preferably the organic solvents include, but are not limited to, benzyl alcohol, xylenes, butanol, propylene glycol methyl ether acetate, diethylene glycol butyl ether, and the like.

It is also with the scope of this invention to include additives conventionally used in solder pastes in the SACA paste of the invention. Such additives may include for example, surfactants (preferably nonionic surfactants), wetting agents, thickening and thixotropic agents, tackifying agents, and the like. The additives are added in conventional amounts or in that amount which does not interfere with the solder wetting of leads and pads to be joined.

The SACA pastes according to the present invention are produced by uniformly mixing the ingredients to form a homogeneous paste. The mixing may occur in a variety of manners known to those of ordinary skill in the art. For example, the paste may be placed in a stainless steel mixing bowl and the bowl placed under a planetary mixer. The mixer may then be started and solder powder slowly added to the mixing bowl, to mix the paste flux and the solder powder. As will be obvious to one skilled in the arts, the standard mixing time for solder pastes prepared in this manner will vary depending upon the viscosity of the mixture. It may be desirable to clean the solder powder with a fluxing agent prior to mixing with the paste. The fluxing agent is removed prior to mixing with the paste.

The resulting SACA paste of the present invention is advantageously used in the soldering of electrical contacts and electrical wires, and particularly, is advantageous for use to fuse electrical components to a circuit board in a surface mount electronic manufacturing process.

The surface mount process of the present invention comprises contacting the SACA paste with the metal pads of a PCB; placing the electrical components onto the PCB wherein the peripheral leads of the electronic component are in contact with the SACA paste coated pads; heating the PCB at a temperature and for a period of time sufficient to cause the SACA paste to reflow or melt; and allowing the PCB to cool. Optionally, when assembling components onto the PCB a sufficient amount of pressure may be placed on the component to provide coplanarity of component leads with the PCB pads. Usually placing a small weight on the component will be sufficient.

The SACA paste may be applied by printing onto the pads of the printed circuit board by any of the techniques known to those of ordinary skill in the art. Suitable techniques for printing the SACA paste onto the pads of the printed circuit board include screen printing, stenciling, and dispensing the SACA paste through a syringe. As will be obvious to those of ordinary skill in the art, the SACA paste may be applied to the pads of the printed circuit board in a variety of other manners without departing from the scope of the present invention. As will also be obvious, the SACA paste may be applied to areas of the printed circuit board other than the pads to attach electrical components to areas of the printed circuit board other than the pads.

After the SACA paste has been applied to the pads of the printed circuit board the electrical components are placed onto the printed circuit board, by hand or machine, in a manner that places the electrical leads of the electrical components in contact with the SACA paste. Optionally, the SACA paste may be dried before placing the component onto the SACA-coated pad to provide a non-tacky surface. In this case, it may be desirable to hold the electrical components in place onto the SACA paste until the SACA paste is reflowed, or to apply a tackifier onto the dried SACA surface.

Next, the SACA paste is caused to reflow by heating the printed circuit board, or the SACA paste areas of the PCB, to a sufficient temperature, and for a sufficient time to cause the solder paste to melt. The printed circuit board is then allowed to cool.

For purposes of this invention, the term "reflow," "reflowed," or "reflowable" is used to mean the melting of the solder alloy during heating to cause wetting of the lead/pad surfaces to be joined.

The resulting PCB has solder joints which maintain anisotropy, or Z-axis electrical conductivity, while retaining electrical insulation properties between adjacent soldered joints even though SACA remains between the leads. As will be obvious to one of ordinary skill in the art, advantages of the process of the invention include that the process does not require cleaning off flux residues from the PCB. The process of the present invention also conformably coats the soldered leads, thus protecting the leads from the environment. This feature is especially useful in fine-pitch electronic components where lead/pad joints are relatively close in proximity.

The following Examples are given as illustrative of the present invention and should not be considered limitative.

EXAMPLE 1

A 50 wt % solution of the polyamide hot-melt adhesive Uni-Rez ® 2642 was made in benzyl alcohol. At room temperature the solution was a rigid paste. To 5 grams of this paste was added 12.5 grams of a very fine solder powder (AMT 148X-6, alloy Sn/Pb 63/37) as received from Advanced Metals Technology, Inc. in Bradford, Conn. The blending was carried out at 60° C. until the mixture was homogeneous. After cooling to room temperature, the viscous paste was applied onto a row of pads and spaces of an etched copper test coupon, such pads/spaces corresponding to the dimensions of lead/spaces of a dummy QFP52T40 surface-mount component. Application of the paste was made by doctor blading same over the pads/spaces using a 5-mil thick tape as a spacer. The tape was then removed. The 13 leads of one side of the quad-flat-pack ("QFP") component were placed on top of the SACA and aligned well with the respective pads of the test coupon. A small weight (5.6 g) was placed on the component to improve coplanarity of the leads onto the pads and the coupon along with component and weight was placed for 9 minutes into a forced-air box oven set at 240° C. Upon cooling the sample, the connections were tested for lead-to-pad connectivity (all resistance values were equivalent to "0" of the ohmmeter), for insulation resistance between adjacent interconnections (all resistance values were above 20 megΩ, i.e., the limit of the ohmmeter) and for pull strength of the soldered interconnection (average for three components on coupon=7,692 psi, or 592 psi per interconnection). The electricals confirmed the anisotropic interconnectivity. Results were recorded in Table 1 below.

EXAMPLE 2

The material and technique used in Example 1 was also used on an etched copper pre-tinned test coupon. Again, the lead-to-pad connectivity was excellent, the resistance between the soldered leads was over 20 megΩ, and the pull strength was good (average for three components=6,960 psi, or 535 psi per interconnection). Results were recorded in Table 1 below.

EXAMPLE 3

A 45 wt % solution of the polyamide hot-melt adhesive Uni-Rez ® 2642 was made in benzyl alcohol. At room temperature this solution was a rigid paste. To 5 grams of this paste was added 12.5 grams of a very fine solder powder (AMT 146X-33, Sn/Pb 63/37) which was pre-treated with a mildly activated rosin flux solution (Indalloy #5-RMA) obtained from Indium Corporation of America in Utica, N.Y. The pre-treatment consisted of refluxing the solder powder in the 5-RMA/IPA solution for four hours, washing twice with IPA and filtering the solder balls, followed by vacuum drying overnight. The blending of this solder powder with the resin solution was carried out at 60° C. until the mixture was homogeneous. The SACA paste was then evaluated in the same manner as in Examples 1 and 2. Results 3a and 3b, respectively, were recorded in Table 1 below.

EXAMPLE 4

To 13.9 grams of a 38.5% solution of Uni-Rez ® 2665 in benzyl alcohol was added 12.5 grams of solder powder (AMT 148X-6, Sn/Pb 63/37) and blended at 60° C. until the mixture was homogeneous. The SACA paste was then evaluated on a pre-tinned copper test coupon as per Example 1. Results were recorded in Table 1 below.

EXAMPLE 5

A 45 wt % solution of a Uni-Rez ® 2642 was made in benzyl alcohol. To 6.9 grams of this paste was added 12.5 grams of fine solder powder (AMT 148X-6, Sn/Pb 63/37) and blended at 60° C. until the mixture was homogeneous. After application of this mixture on the pads of a pre-tinned copper test coupon and subsequent placement of a QFP52T40 component, the coupon (including a 5.6 gram weight on the QFP) was first heated to 215° C. for 10 minutes, followed by 240° C. for 3 minutes. Test results were recorded in Table 1 below.

EXAMPLE 6

A 29.4 wt % solution of Uni-Rez ® 2642 was made in n-butanol. To 12.0 grams of this mixture was added 12.5 grams of a fine solder powder (AMT 148X-6, Sn/Pb 63/37) and blended at 60° C. until homogeneous. The paste was then evaluated on a cleaned (Oakite 31 ® dip) etched copper test coupon. The sample was pre-heated to 180° C./10 min; soldering was done at 240° C./3 min. Anisotropy was observed as recorded in Table 1 below.

EXAMPLE 7-13

Various SACA pastes were made by the method described in Example 1, but using different weight percentages of the solder powder as listed in Table 1 as Examples 7-13, respectively. After application of the paste onto the pads of the appropriate size test coupon, the paste was pre-dried at 170° C. for 2 minutes. The leads of one side of a QFP component were then placed onto the SACA. A small weight was placed onto the component and the assembly was then heated to 240° C. for 7 minutes. After cooling and removing the weight, the lead/pad connections were tested with the ohmmeter by the method described in Example 1. Results are given in Table 1.

TABLE 1

| Example | Resin/Solvent[1] | Solder[4] (wt %) (b.o. solids) | Solder[5] Treatment | Av. Pull Strength[2] per Lead (psi) QFP52T40 e-Cu | Av. Pull Strength[2] per Lead (psi) QFP52T40 t-Cu | Av. Pull Strength[2] per Lead (psi) QFP208T19.7 t-Cu | Resistance[3] ($\Omega$) Z-axis | Resistance[3] ($\Omega$) X-Y plane |
|---|---|---|---|---|---|---|---|---|
| 1 | U2642/BA | Sn/Pb (83.3) | None | 592 | | | 0 | >20 Meg |
| 2 | U2642/BA | Sn/Pb (83.3) | None | | 535 | | 0 | >20 Meg |
| 3a | U2642/BA | SN/Pb (84.7) | refl. 5 RMA | 324 | | | 0 | >20 Meg |
| 3b | U2642/BA | SN/Pb (84.7) | refl. 5 RMA | | 387 | | 0 | >20 Meg |
| 4 | U2665/BA | SN/Pb (70.0) | None | | 310 | | 0 | >20 Meg |
| 5 | U2642/BA | SN/Pb (80.1) | None | NT | NT | | 0 | >20 Meg |
| 6 | U2642/BOL | SN/Pb (78.0) | None | NT | NT | | 0 | >20 Meg |
| 7 | U2642/BA | SN/Pb (70.0) | None | | | 58 | 0 | >20 Meg |
| 8 | U2642/BA | SN/Pb (65.0) | None | | | 170 | 0 | >20 Meg |
| 9 | U2642/BA | SN/Pb (65.0) | None | | 421 | | 0 | >20 Meg |
| 10 | U2642/BA | SN/Pb (65.0) | None | | | 93 | 0 | >20 Meg |
| 11 | V1870//BA/X | SN/Pb (70.0) | None | | 67 | | 0 | >20 Meg |
| 12 | V3300/PMA | SN/Pb (70.0) | None | | 108 | | 0 | >20 Meg |
| 13 | V3300/PMA | SN/Pb (70.0) | None | | 172 | | 0 | >20 Meg |

Note:
[1]U2642/BA = Uni-Rez ® 2642 in benzyl alcohol.
U2665/BA = Uni-Rez ® 2665 in benzyl alcohol.
V1870/BA/X = Vitel ® 1870 in benzyl alcohol and xylenes.
V3300/PMA = Vitel ® 3300 in Dowanol ® PMA.
BOL - n-butanol.
[2]NT = not tested.
e-Cu = etched copper test coupons cleaned in Oakite 31 ®.
t-Cu = etched and pre-tinned copper test coupon, as-received.
[3]Z-axis - through interconnection;
X-Y - between adjacent interconnections;
O - ohmmeter "zero."
[4]Sn/Pb - tin/lead.
[5]Refl. 5 RMA = refluxing in 25-30% RMA flux/IPA solution followed by washings with IPA.

We claim:

1. An anisotropically-conductive solder paste composition which comprises finely-divided metal alloy particles dispersed in a solution of an organic polymer in an organic solvent which has a boiling point above the softening temperature of the polymer and no higher than the melting point of the metal alloy particles, wherein the polymer has a softening temperature at or below the melting point of the metal alloy particles and where said composition is free of a fluxing agent.

2. The solder paste composition of claim 1 in which the metal alloy particles are selected from the group consisting of tin/lead alloy, tin/lead/silver alloy, bismuth/tin alloy, and indium/tin alloy.

3. The solder paste composition of claim 1 in which the particle size of the metal alloy particles is less than about 74 microns.

4. The solder paste composition of claim 3 in which the particle size of the metal alloy particles is less than about 15 microns.

5. The solder paste composition of claim 1 wherein the organic polymer is a thermoplastic polymer which is heat-softenable at or below the melting point of the metal alloy particles.

6. The solder paste composition of claim 5 wherein the thermoplastic polymer is a polyester, a polyvinyl chloride, a polyvinyl fluoride, a polyamide, a polyethylene, a polystyrene or a polyurethane.

7. The solder paste composition of claim 1 in which metal alloy particles are present in an amount of about 50 to about 90 weight percent based on the total weight of the paste.

8. The solder paste composition of claim 5 in which said solution of organic polymer in an organic solvent is from about 10 to about 50 weight percent based on the total weight of the paste.

9. The solder paste composition of claim 1 in which said solvent is selected from the group consisting of aliphatic and aromatic alcohols, aliphatic and aromatic esters, aromatic and aliphatic hydrocarbons, aromatic-aliphatic hydrocarbons, and mixtures thereof.

10. A surface mount electronic manufacturing process comprising
   a) applying an anisotropically-conductive solder paste onto the pads and spaces of a printed circuit board;
   b) placing electronic surface mount components onto the printed circuit board wherein the leads of the electronic components are in contact with the solder paste coated pads;
   c) heating the printed circuit board at a temperature and for a period of time sufficient to cause the solder paste to melt; and
   d) allowing the printed circuit board to cool; wherein the solder paste is free of a fluxing agent and comprises finely-divided metal alloy particles dispersed in a solution of an organic polymer in an organic solvent which has a boiling point above the softening temperature of the polymer and no higher than the melting temperature of the metal alloy particles and wherein the polymer has a softening temperature at or below the melting point of the metal alloy particles.

11. The process of claim 10 in which the organic polymer is a thermoplastic polymer which is heat-softenable at or below the melting point of the metal alloy particles.

12. The process of claim 11 in which said thermoplastic polymer is selected from the group consisting of polyamides, polyesters, and polyvinyl chlorides, polyvinyl fluorides, polyethylenes, polyurethanes, or polystyrenes.

13. The process of claim 10 in which the metal alloy particles are selected from the group consisting of tin/lead alloy, tin/lead/silver alloy, bismuth/tin alloy, and indium/tin alloy.

14. The process of claim 11 in which the volatile organic solvent is selected from the group consisting of aliphatic and aromatic alcohols, aliphatic and aromatic esters, aliphatic and aromatic hydrocarbons, aromatic-aliphatic hydrocarbons, and mixtures thereof.

15. The process of claim 10 which further comprises the step of applying pressure onto the electronic surface mount components between steps (b) and (c), wherein said pressure is applied in an amount sufficient to provide coplanarity of the component leads with the pads of the printed circuit board.

* * * * *